United States Patent
Lin

(10) Patent No.: US 8,283,984 B2
(45) Date of Patent: Oct. 9, 2012

(54) METHOD AND APPARATUS OF PHASE LOCKING FOR REDUCING CLOCK JITTER DUE TO CHARGE LEAKAGE

(75) Inventor: Chia-Liang Lin, Fremont, CA (US)

(73) Assignee: Real Tek Semiconductor Corp., Hsinchu (TW)

( * ) Notice: Subject to any disclaimer, the term of this patent is extended or adjusted under 35 U.S.C. 154(b) by 111 days.

(21) Appl. No.: 12/830,317

(22) Filed: Jul. 3, 2010

(65) Prior Publication Data

US 2011/0012683 A1 Jan. 20, 2011

Related U.S. Application Data

(60) Provisional application No. 61/226,657, filed on Jul. 17, 2009.

(51) Int. Cl.
*H03L 7/00* (2006.01)

(52) U.S. Cl. ............ 331/11; 331/1 A; 331/34; 331/16; 327/156

(58) Field of Classification Search ............ 331/11, 331/1 A, 34, 16; 327/156
See application file for complete search history.

(56) References Cited

U.S. PATENT DOCUMENTS

| | | | | |
|---|---|---|---|---|
| 5,142,246 A | * | 8/1992 | Petersson | 331/11 |
| 6,094,078 A | | 7/2000 | Suzuki | |
| 6,281,727 B1 | * | 8/2001 | Hattori | 327/156 |
| 6,608,511 B1 | * | 8/2003 | Hsu | 327/157 |

FOREIGN PATENT DOCUMENTS

JP 2007-184778 A 7/2007

\* cited by examiner

*Primary Examiner* — Arnold Kinkead

(74) *Attorney, Agent, or Firm* — Thomas, Kayden, Horstemeyer & Risley, LLP

(57) ABSTRACT

A phase lock loop is disclosed comprising a first phase detector configured to receive a first clock and a second clock and output a first detector output signal; a second phase detector configured to receive the first clock and the second clock and output a second detector output signal; a summing circuit to sum the first detector output signal and the second detector output signal into a control signal; a loop filter to filter the control signal into a refined control signal; and a controllable oscillator to generate the output clock in accordance with a control by the refined control signal.

19 Claims, 3 Drawing Sheets

METHOD AND APPARATUS OF PHASE LOCKING FOR REDUCING CLOCK JITTER DUE TO CHARGE LEAKAGE

FIELD OF TECHNOLOGY

This disclosure relates generally to method and apparatus of phase locking.

BACKGROUND

A phase lock loop (PLL) is an important apparatus for numerous applications. A PLL receives a reference clock and generates accordingly an output clock that is phase locked with the reference clock. A phase lock loop typically comprises a controller and a controlled oscillator. The controlled oscillator outputs an output clock with a frequency controlled by a control signal generated by the controller. The output clock is usually divided down by a factor of N, where N is an integer, resulting in a divided-down clock. The controller issues the control signal based on detecting a phase difference between a reference clock and the divided down clock. The frequency of the output clock is thus controlled in a closed-loop manner so as to minimize the phase difference between the reference clock and the divided-down clock. In a steady state, the output clock is thus phase locked with the reference clock.

In a typical PLL, the controller comprises a phase detector and a filter. The phase detector receives the reference clock and the divided-down clock and outputs a detector output signal representing the phase difference between the reference clock and the divided-down clock. The filter receives and converts the detector output signal into the control signal to control the controlled oscillator. In a typical PLL, the phase detector comprises a PFD (phase/frequency detector) and a charge pump circuit, and the resultant detector output signal is a current-mode signal. The filter filters and converts the current-mode detector output signal into a voltage-mode control signal to control the oscillator, which is a voltage-controlled oscillator (VCO). Modern phase lock loops are usually implemented in a CMOS (complementary metal-oxide semiconductor) integrated circuit. In a deep submicron CMOS integrated circuit, high-speed devices of short channel lengths are prone to charge leakage. In particular, the charge pump circuit, whose purpose is to generate the detector output signal to represent the phase difference between the reference clock and the divided-down clock, is prone to charge leakage. This effectively introduces an error in the phase detection, which results in an error in the voltage-mode control signal and thus an error in the phase/frequency of the output clock. The error in the phase/frequency of the output clock is generally referred to as clock jitter.

What is needed is a method to reduce the clock jitter due to charge leakage of the charge pump circuit.

DETAILED DESCRIPTION

The following detailed description refers to the accompanying drawings which show, by way of illustration, various embodiments in which the invention may be practiced. These embodiments are described in sufficient detail to enable those skilled in the art to practice these and other embodiments. The various embodiments are not necessarily mutually exclusive, as some embodiments can be combined with one or more other embodiments to form new embodiments. The following detailed description is, therefore, not to be taken in a limiting sense.

In an embodiment, a phase lock loop is disclosed, the phase lock loop comprising: a first phase detector configured to receive a first clock and a second clock and output a first detector output signal; a second phase detector configured to receive the first clock and the second clock and output a second detector output signal; a summing circuit to sum the first detector output signal and the second detector output signal into a control signal; a loop filter to filter the control signal into a refined control signal; and a controllable oscillator to generate the output clock in accordance with a control by the refined control signal.

In an embodiment, a method of phase locking is disclosed, the method comprising: receiving a first clock and a second clock; generating a first phase detector output signal to represent a timing difference between the first clock and the second clock using a primary phase detector; generating a second phase detector output signal to represent the timing difference between the first clock and the second clock using a secondary phase detector; summing the first detector output signal and the second phase detector output signal into a control signal; filtering the control signal into a refined control signal; and generating an output clock in accordance with a frequency controlled by the refined control signal.

Figure 1:
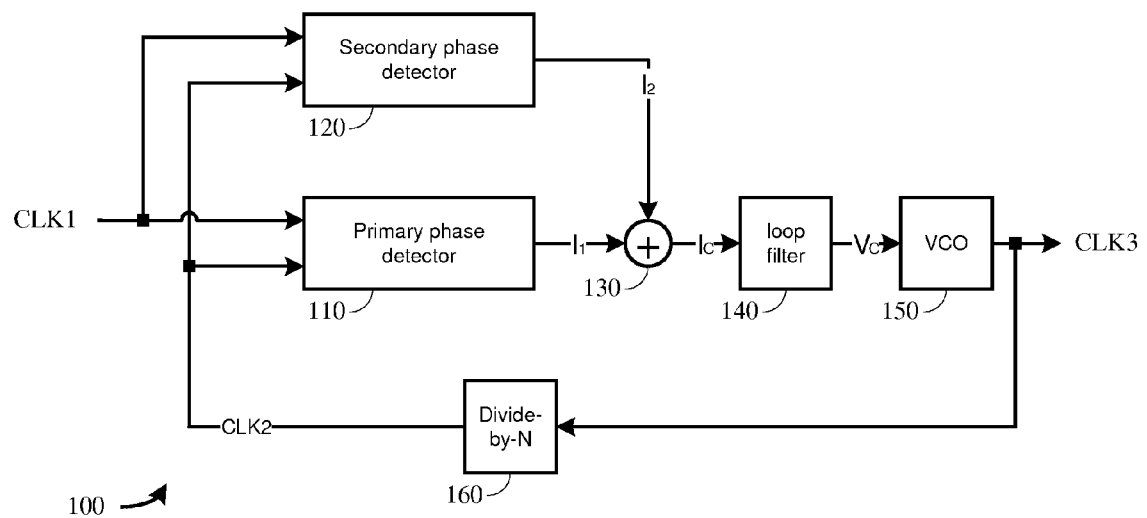
FIG. 1 shows a functional block diagram of a phase lock loop in accordance with the present invention.

FIG. 1 shows a functional block diagram of a phase lock loop 100 in accordance with an embodiment of this invention. PLL 100 comprises: a primary phase detector 110 for receiving a first clock CLK1 (which is a reference clock) and a second clock CLK2 (which is a divided-down clock) and outputting a first detector output signal $I_1$; a secondary phase detector 120 for receiving the first clock CLK1 and the second clock CLK2 and outputting a second detector output signal $I_2$; a summing circuit 130 for combining the first detector output signal $I_1$ and the second detector output signal $I_2$ into a raw control signal $I_C$; a loop filter 140 for receiving and converting the raw control signal $I_C$ into a refined control signal $V_C$; a controllable oscillator 150, which is embodied by a voltage-controlled oscillator (VCO), for generating a third clock CLK3 (which is an output clock) in accordance with a control by the refined control signal $V_C$; and a divide-by-N circuit 160 for receiving and dividing down the third clock CLK3 by a factor of an integer N to generate the second clock CLK2. The primary phase detector 110 utilizes a high-speed output circuit that is prone to charge leakage at its output due to using short-channel devices for achieving high speed. The charge leakage is effectively a constant current drain at the output of the first phase detector 110. In other words, the first detector output signal $I_1$, comprises a component of a constant current drain that is substantially independent of the phase detection. The secondary phase detector 120 utilizes a low-speed output circuit that has very low charge leakage at its output due to using long-channel devices. In a steady state, the second detector output signal $I_2$ approximately offsets the component of the constant current drain in the first detector output signal $I_1$. The detrimental effect of charge leakage at the output of the primary phase detector 110 due to using high-speed short-channel devices is thus alleviated.

Figure 2:
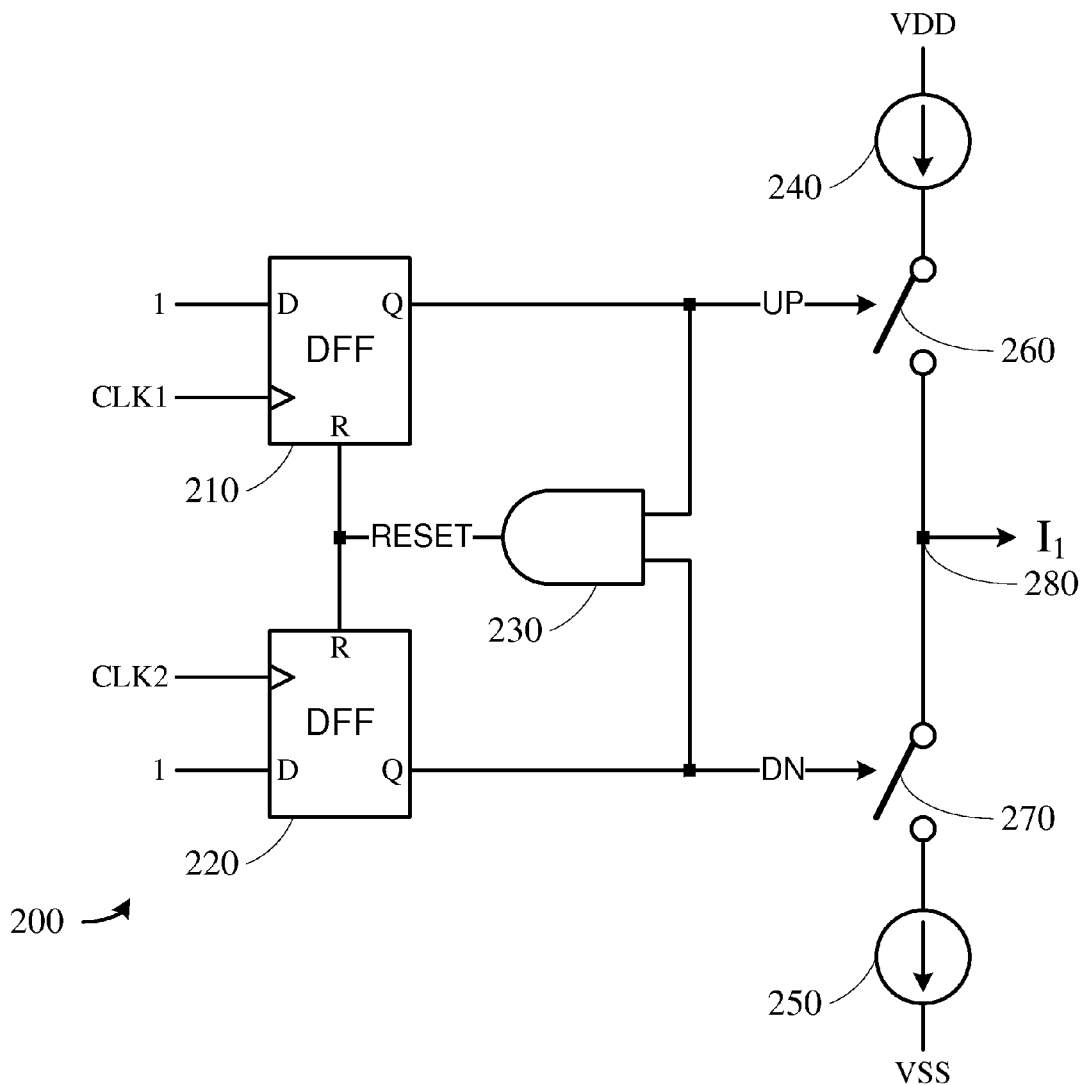
FIG. 2 shows a schematic diagram of an exemplary primary phase detector circuit.

FIG. 2 depicts a schematic diagram of a circuit 200 suitable for embodying the primary phase detector 110 of FIG. 1. Circuit 200 comprises a first DFF (data flip flop) 210, a second DFF 220, an AND gate 230, a current source 240, a current sink 250, a first switch 260, and a second switch 270. Here, VDD denotes a first fixed-potential circuit node that is generally referred to as a supply node, and VSS denotes a second fixed-potential circuit node that is generally referred to as a ground node. Each DFF has a data input terminal (denoted by "D"), an edge trigger terminal (denoted by arrow), an output terminal (denoted by "Q"), and a reset terminal (denoted by "R"). Both DFF 210 and 220 receive logical 1 (or HIGH) as input. The first DFF 210 is triggered at a rising edge of the first clock CLK1, resulting in a first logical signal UP. The second DFF 220 is triggered at as rising edge of the second clock CLK2, resulting in a second logical signal DN. The AND gate 230 receives the first logical signal UP and the second logical signal DN and outputs a reset signal RESET for resetting both DFF 210 and 220 shortly after both UP and DN are asserted. The current source 240 delivers current to an output node 280 via the first switch 260. The current sink 250 drains current from the output node 280 via the second switch 270. The first switch 260 is controlled by the first logical signal UP, and the second switch 270 is controlled by the second logical signal DN. In this manner, the first detector output signal $I_1$ is a current-mode signal transmitted from node 280. Circuit 200 is a typical phase detector circuit that is widely used and well known and thus its principle is not described in detail here. In deep submicron CMOS integration circuit embodiment, however, switches 260 and 270 are prone to charge leakage and cannot be effectively switched off even when their respective controlling logical signals are not asserted. The secondary phase detector circuit is used to alleviate this problem.

Figure 3:
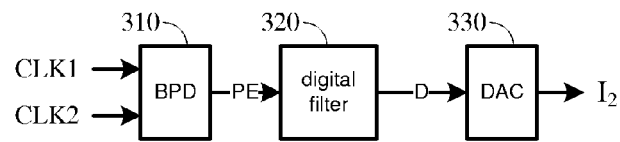
FIG. 3 shows a functional block diagram of an exemplary secondary phase detector circuit.

FIG. 3 depicts a functional block diagram of a circuit 300 suitable for embodying the secondary phase detector 120 of FIG. 1. Circuit 300 comprises: a binary phase detector (BPD) 310 for receiving the first clock CLK1 and the second clock CLK2 and outputting a logical signal PE for indicating a timing relationship between the two clocks; a digital filter 320 for receiving the logical signal PE and outputting a control code D; and a digital-to-analog converter (DAC) 330 for receiving the control code and outputting the second detector output signal $I_2$. In an embodiment, the logical signal PE is set to 1 (or HIGH) when the first clock CLK1 leads the second clock CLK2 in a timing comparison, and set to 0 (or LOW) when the first clock CLK1 trails the second clock CLK2 in the timing comparison. In an embodiment, the logical signal PE is generated by using the second clock CLK2 to sample the first clock CLK1. The digital filter 320 updates the control code D based on a recent history of the logical signal PE. In an embodiment, by way of example but not limitation, the digital filter 320 updates the control code D once for every M samples of the logical signal PE, where M is an integer. The control code D is incremented if there are more 1's than 0's in the M samples of the logical signal PE; the control code D is decremented if there are more 0's than 1's in the M samples of the logical signal PE. The DAC 330 converts the control code D into the second detector output signal $I_2$. In an embodiment, the DAC 330 comprises a plurality of current elements, whose outputs are tied together to form the second detector output signal $I_2$. Each current element has two discrete output levels and is controlled by a respective bit of the control code D. In this manner, the current signal $I_2$ is controlled by the control code D. In a steady state, the control code is established in a closed loop to minimize the timing difference between the first clock CLK1 and the second clock CLK2. When the timing difference is minimized, the clock jitter (of CLK3) is also minimized. To satisfy this condition, the current signal $I_2$ must be established so as to best offset the leakage current. In this manner, the detrimental effect of the charge leakage is alleviated. In an embodiment, DAC 300 uses low-speed devices that are substantially immune from charge leakage. This is acceptable because the control code D is not updated very often. In an embodiment, the second phase detector signal $I_2$ is a zero-order-hold signal; the zero-order-hold signal can more effectively cancel the charge leakage (at the output of the primary phase detector).

Figure 4:
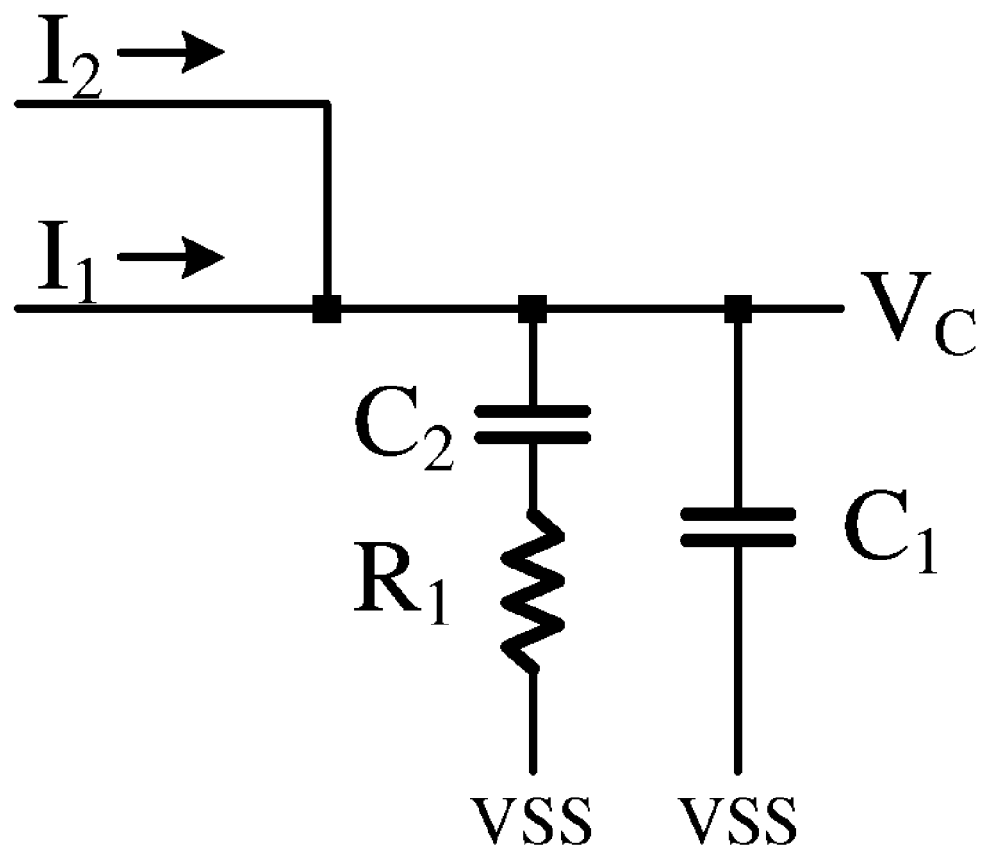
FIG. 4 shows a schematic diagram of an exemplary loop filter.

FIG. 4 depicts a schematic diagram of a circuit 400 suitable for embodying the summing circuit 130 and the loop filter 140 of FIG. 1. The summing circuit is implicitly embodied by tying together two current-mode signals $I_1$ and $I_2$. The filter circuit is embodied by a parallel connection of a first capacitor $C_1$ and a series R-C circuit comprising a second capacitor $C_2$ and a resistor R. The filter circuit effectively receives a sum of the two detector output signals $I_1$ and $I_2$ and converts it into the refined control signal $V_C$.

Various embodiments of a voltage-controlled oscillator (VCO) are well known to those of ordinary skill in the art and thus not described in detail here. Also, various embodiments of a divide-by-N circuit are well known to those of ordinary skill in the art and thus not described in detail here.

Now refer back to FIG. 1. In an embodiment, the secondary phase detector 120 is disabled during a first phase (after a system startup). During the first phase, PLL 100 behaves similarly to a prior art PLL and settles into a first steady state, wherein a current leakage at the output of the primary phase detector 110 leads to a clock jitter at the output of the VCO 150. After the first steady state is established, PLL 100 enters into a second phase, wherein the secondary phase detector 120 is enabled, and the second detector output signal $I_2$ is gradually updated and established to offset the current leakage at the output of the primary phase detector 110. This leads to a reduction of clock jitter at the output of the VCO 150.

In some applications, an additional charge leakage occurs between the loop filter 140 and the VCO 150 due to using short-channel devices for interfacing the two functional blocks. However, the additional charge leakage is also offset by the second detector output signal $I_2$, since the second detector output signal $I_2$ is established to minimize the clock jitter (of CLK3) due to charge leakage, regardless of the source of the leakage.

Although specific embodiments have been illustrated and described herein, it will be appreciated by those of ordinary skill in the art that any arrangement that is calculated to achieve the same purpose may be substituted for the specific embodiments shown. This application is intended to cover adaptations and variations of the embodiments discussed herein. Various embodiments use permutations and/or combinations of embodiments described herein. It is to be understood that the above description is intended to be illustrative, and not restrictive, and that the phraseology or terminology employed herein is for the purpose of description.

What is claimed is:

1. An apparatus for generating an output clock, comprising:
   a first phase detector configured to receive a first clock and a second clock and output a first detector output signal;
   a second phase detector configured to receive the first clock and the second clock and output a second detector output signal, wherein the first phase detector has a first charge leakage and the second phase detector has a second charge leakage, the first charge leakage is larger than the second charge leakage;
   a summing circuit to sum the first detector output signal and the second detector output signal into a control signal;

a loop filter to filter the control signal into a refined control signal; and a controllable oscillator to generate the output clock in accordance with a control by the refined control signal;

wherein the second clock corresponds to the output clock.

2. The apparatus of claim 1, wherein the second detector output signal is a zero-order hold signal.

3. The apparatus of claim 1, wherein the first detector output signal comprises a component of a constant current drain that is substantially independent of the phase detection.

4. The apparatus of claim 1, wherein the second detector output signal is established to offset the current leakage at the output of the first phase detector.

5. The apparatus of claim 1, wherein the second phase detector is disabled during a first phase and enabled during a second phase.

6. The apparatus of claim 5, wherein the apparatus enters the second phase after a steady state of the apparatus is established.

7. The apparatus of claim 1, wherein the second detector output signal is established to reduce a clock jitter of the output clock due to a charge leakage of the apparatus.

8. The apparatus of claim 7, wherein the charge leakage of the apparatus comprises at least one of charge leakages of the loop filter, the controllable oscillator and the first phase detector.

9. The apparatus of claim 1, the second phase detector comprising:
a phase detector for receiving the first clock and the second clock and outputting a logical signal for indicating a timing relationship between the two clocks;
a digital filter for receiving the logical signal and outputting a control code; and
a digital-to-analog converter (DAC) for receiving the control code and outputting the second detector output signal.

10. The apparatus of claim 1, the summing circuit comprising a first capacitor and a R-C circuit comprising a second capacitor and a resistor, the first capacitor is coupled to the R-C circuit in parallel.

11. A method of phase locking, the method comprising:
receiving a first clock and a second clock;
generating a first phase detector output signal to represent a timing difference between the first clock and the second clock using a primary phase detector;
generating a second phase detector output signal to represent the timing difference between the first clock and the second clock using a secondary phase detector;
summing the first detector output signal and the second phase detector output signal into a control signal; and
filtering the control signal into a refined control signal;
generating an output clock in accordance with a frequency controlled by the refined control signal, wherein the second clock corresponds to the output clock;
wherein the step of generating the second detector output signal is disabled during a first phase and enabled during a second phase.

12. The method of claim 11, wherein the first detector output signal comprises a component of a constant current drain that is substantially independent of the phase detection.

13. The method of claim 11, wherein the second detector output signal is established to offset the current leakage at the output of the first phase detector.

14. The method of claim 11, wherein the second detector output signal is established to reduce a clock jitter of the output clock.

15. The method of claim 11, wherein the second detector output signal is a zero-order hold signal.

16. The method of claim 11, the step of generating the second detector output signal further comprising:
outputting a logical signal for indicating a timing relationship between the first clock and the second clock;
outputting a control code according to the logical signal; and
outputting the second detector output signal according to the control code.

17. An apparatus for generating an output clock, comprising:
a first phase detector configured to receive a first clock and a second clock and output a first detector output signal, wherein the second clock corresponds to the output clock;
a second phase detector configured to receive the first clock and the second clock and output a second detector output signal;
a summing circuit to sum the first detector output signal and the second detector output signal into a control signal;
a loop filter to filter the control signal into a refined control signal; and
a controllable oscillator to generate the output clock in accordance with a control by the refined control signal;
wherein the first phase detector comprises a hiqh-speed device and the second phase detector comprises a low-speed device.

18. The apparatus of claim 17, wherein the first phase detector has a first charge leakage and the second phase detector has a second charge leakage, the first charge leakage is larger than the second charge leakage.

19. The apparatus of claim 17, wherein the high-speed device is a short-channel device, and the low-speed device is a long-channel device.

* * * * *